(12) United States Patent
Zablocki et al.

(10) Patent No.: US 8,338,268 B2
(45) Date of Patent: Dec. 25, 2012

(54) TRANSFER METHOD FOR THIN FILM NANOMEMBRANE STRUCTURES

(75) Inventors: Mathew Joseph Zablocki, Newark, DE (US); Ahmed Sharkawy, Newark, DE (US); Dennis W. Prather, Newark, DE (US)

(73) Assignee: Lumilant, Inc., Newark, DE (US)

(\*) Notice: Subject to any disclaimer, the term of this patent is extended or adjusted under 35 U.S.C. 154(b) by 0 days.

(21) Appl. No.: 13/050,686

(22) Filed: Mar. 17, 2011

(65) Prior Publication Data

US 2011/0230035 A1 Sep. 22, 2011

Related U.S. Application Data

(60) Provisional application No. 61/314,614, filed on Mar. 17, 2010.

(51) Int. Cl.
*H01L 21/762* (2006.01)

(52) U.S. Cl. ......... 438/458; 257/E21.122; 257/E21.567; 257/E21.568; 438/455; 438/689; 438/710; 438/712; 438/725

(58) Field of Classification Search ........... 257/E21.122, 257/E21.567, E21.568; 438/455, 458, 689, 438/710, 712, 725

See application file for complete search history.

(56) References Cited

OTHER PUBLICATIONS

Niklaus et al., "Wafer—level membrane transfer bonding of polycrystalline silicon bolometers for use in infrared focal plane arrays," J. Micromech. Microeng., vol. 11(2001), p. 509-513.*

\* cited by examiner

*Primary Examiner* — Asok Sarkar
(74) *Attorney, Agent, or Firm* — Connolly Bove Lodge & Hutz LLP

(57) ABSTRACT

A transfer process for silicon nanomembranes (SiNM) may involve treating a recipient substrate with a polymer structural support. After treating the recipient substrate, a substrate containing the intended transferable devices may be brought in direct contact with the aforementioned polymer layer. The two substrates may then go through a Deep Reactive Ion Etch (DRIE) to remove at least a portion of the substrate containing the devices. Oxide may be selectively removed with a buffered oxide wet etch, leaving the transferred SiNM on the recipient substrate with the Underlying polymer layer.

8 Claims, 1 Drawing Sheet

1. Recipient substrate preparation

2. SOI device to be transferred

3. Flip SOI Platform

4. Bond Inverted SOI platform to SU-8 surface

5. DRIE removal of SOI Si Handle

6. Selective oxide etch of revealed SOI oxide

US 8,338,268 B2

TRANSFER METHOD FOR THIN FILM NANOMEMBRANE STRUCTURES

CROSS-REFERENCE TO RELATED APPLICATION

This application claims priority to U.S. Provisional Patent Application No. 61/314,614, filed on Mar. 17, 2010, and incorporated by reference herein.

BRIEF SUMMARY OF EMBODIMENTS OF THE INVENTION

An embodiment of the present invention may be directed to a transfer process for silicon nanomembranes (SiNM). By removing the top device layer of a silicon-on-insulator (SOI) wafer, and transferring the silicon layer to a new substrate, embodiments of the present invention may allow crystalline layers of silicon to be stacked and integrated on multiple substrates. Thus, embodiments, of the invention may be directed to a new process to transfer large area SiNMs, independent of SiNM features. For example, large area SiNM may be transferred with areas of 1.5 $cm^2$, and the process may be scalable to wafer dimensions.

BRIEF DESCRIPTION OF THE DRAWINGS

Embodiments of the invention will now be further described in the following more detailed description to be read with reference to the accompanying drawing, in which.

DETAILED DESCRIPTION OF EMBODIMENTS OF THE INVENTION

Figure 1:
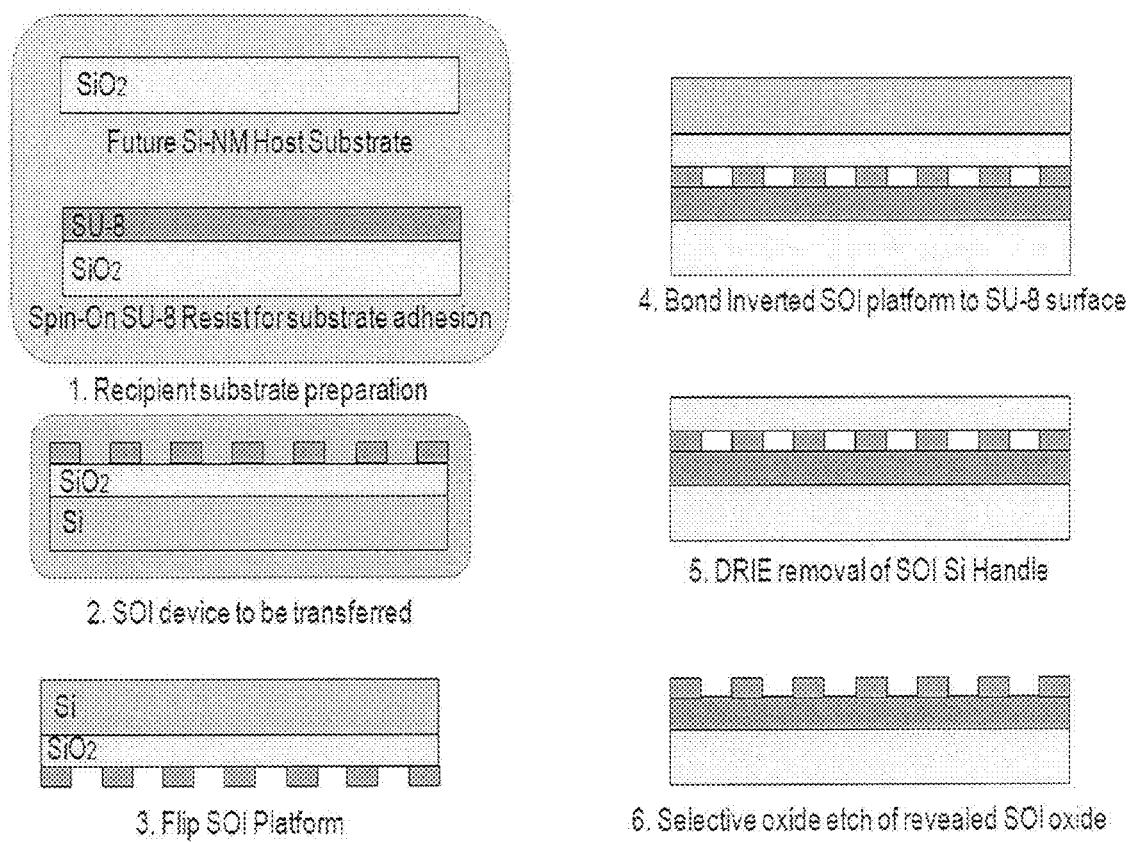
FIG. 1 illustrates an embodiment of a process flow for the fabrication and transferring of a SiNM from an SOI substrate to a $SiO_2$ substrate.

An embodiment of the present invention may be directed to a novel transfer process for silicon nanomembranes (SiNM). To transfer the SiNM, a recipient substrate may first be treated with a polymer structural. support that may serve to aid in the adhesion of the membrane during the transfer process. The polymer, for example SU-8, may be applied in a spin-on process, capable of varying the polymer thickness via adjusting spin-on speeds, to accommodate device designs. SU-8 may be a chosen polymer for the transfer in an embodiment of the invention because of its robust mechanical properties, chemical stability and low optical loss after hardbake. However, it should be apparent to one skilled in the art that a variety of polymeric materials can be used. A sacrificial polymer layer, such as cyclohexyl methacrylate (CHMA), which may be decomposed by thermal treatment, may be used to function as the polymer support layer and may be selectively removed after transfer.

After treating the recipient substrate, the SOI substrate containing the intended transferable devices may be inverted and brought in direct contact with the aforementioned polymer layer. To aid in removing air pockets that might get trapped between the substrates, the substrates may be heated to a temperature >60° C. to reflow the polymer. This may permit air to escape from between the polymer layer and SOI substrate and may thus result in a more uniform transfer. The reflow step may also allow for fine adjustment of the alignment of the SiNM in relation to underlying structures on the recipient substrate. The two substrates may then go through a Deep Reactive Ion Etch (DRIE), e.g., with SF6 chemistry, to remove the handle of the SOI substrate.

According to an embodiment of the invention, the DRIE recipe may be tuned to be selective to the silicon, to thus etch away the SOI Si handle and use a BOX layer of the SOI substrate as an etch stop. The DRIE process may typically be capable of etching the silicon handle at a rate >6 μm/min. After the Si handle is removed, the oxide may be selectively removed, e.g., with a buffered oxide wet etch, leaving the transferred SiNM on the recipient substrate with the underlying polymer layer. A wet etch with HF may still be used because of its high etch selectivity to the $SiO_2$, while not compromising the silicon device structures. However, it is possible that a DRIE process can later replace the HF etch to make the transfer process manufacturable on a large scale.

As is known to those skilled in the art, conventional transfer methods, such as PDMS stamping, may be limited in sample size, may not be compatible with CMOS technology, and may involve mechanical handling of the sample during the transfer process, which might cause stress and even damage to the membrane. Embodiments of the invention may differ from present NM transfer technology by utilizing the rigid SOI platform to assure a flat and uniform transfer of an entire SiNM, un-patterned or patterned with arbitrary architecture. Embodiments of the invention can transfer multiple arrays of SiNMs that are isolated from each other in a single transfer process.

The mechanical properties of SiNMs may allow for the membrane to be transferred to contoured surfaces. Embodiments of the present invention may limit the SiNMs to be transferred to planar surfaces. However, embodiments of the invention may employ a method to first transfer the SiNM to a planar flexible surface that may then be manipulated to fit arbitrary contoured surfaces.

FIG. 1 illustrates an embodiment of a process flow for the fabrication and transferring of a SiNM from an SOI substrate to a $SiO_2$ substrate. In Step 1, the recipient substrate may be prepared, e.g., by applying SU-8 polymer. Step 2 illustrates the SOI device that may be transferred. Step 3 illustrates flipping of the SOI platform. In Step 4, the inverted SOI platform may be bonded to the SU-8 surface formed on the recipient substrate. Step 5 illustrates DRIE removal of the SOI Si handle. Step 6 illustrates selective oxide etch of revealed SOI oxide.

The foregoing description of the invention illustrates and describes embodiments of the present invention. It is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form or application disclosed herein.

What is claimed is:

1. A method of transferring a silicon nanomembrane formed on a first substrate, the method comprising:
    forming a polymer layer on a second substrate to receive the silicon nanomembrane;
    bonding a side of the first substrate on which the silicon nanomembrane is formed to the polymer layer on the second substrate; and
    performing an etching process to remove the first substrate, wherein the polymer layer includes a sacrificial polymer layer, and wherein the method further comprises applying a thermal treatment to selectively remove the sacrificial polymer layer by decomposition during or after said transferring.

2. The method of claim 1, further comprising:
performing a further selective etching process.

3. The method of claim 1, wherein the selective etching process comprises a selective wet etching process to remove oxide.

4. The method of claim 1, wherein the etching process comprises deep reactive ion etching.

5. The method of claim 1, further comprising heating the substrates prior to performing an etching process.

6. The method of claim 5, wherein said heating is to a temperature of greater than 60° C.

7. The method of claim 1, wherein said forming a polymer layer comprises forming a polymer layer using a spin-on process.

8. A method of transferring a silicon nanomembrane formed on a first substrate, the method comprising:
   forming a polymer layer on a second substrate to receive the silicon nanomembrane;
   bonding a side of the first substrate on which the silicon nanomembrane is formed to the polymer layer on the second substrate; and
   performing an etching process to remove the first substrate,
   wherein the second substrate is a flexible planar substrate of sufficient flexibility to permit manipulation to fit an arbitrarily contoured surface.

* * * * *